(12) United States Patent
Wennekamp et al.

(10) Patent No.: US 7,180,776 B1
(45) Date of Patent: Feb. 20, 2007

(54) SYSTEMS AND METHODS FOR PROGRAMMING A SECURED CPLD ON-THE-FLY

(75) Inventors: Wayne Edward Wennekamp, Rio Rancho, NM (US); Eric E. Edwards, Albuquerque, NM (US); Roy D. Darling, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 206 days.

(21) Appl. No.: 11/048,347

(22) Filed: Feb. 1, 2005

Related U.S. Application Data

(60) Division of application No. 10/640,342, filed on Aug. 12, 2003, now Pat. No. 6,873,177, which is a continuation-in-part of application No. 10/233,243, filed on Aug. 30, 2002, now Pat. No. 6,714,041.

(51) Int. Cl.
*G11C 11/34* (2006.01)
*G06F 15/00* (2006.01)
*G06G 11/30* (2006.01)

(52) U.S. Cl. .................... 365/185.04; 365/185.08; 365/218; 712/37; 713/189; 713/190; 713/193; 326/8; 326/38

(58) Field of Classification Search .......... 365/185.04; 713/190, 193; 712/37; 326/8
See application file for complete search history.

(56) References Cited

U.S. PATENT DOCUMENTS

| | | | |
|---|---|---|---|
| 5,915,017 A | 6/1999 | Sung et al. | |
| 6,076,149 A | 6/2000 | Usami et al. | |
| 6,102,963 A | 8/2000 | Agrawal | |
| 6,137,308 A | 10/2000 | Nayak | |
| 6,331,784 B1 | 12/2001 | Mason et al. | |
| 6,363,019 B1 | 3/2002 | Erickson et al. | |
| 6,499,124 B1 | 12/2002 | Jacobson | |
| 6,507,213 B1 | 1/2003 | Dangat | |
| 6,531,889 B1 | 3/2003 | Leitch | |
| 6,538,468 B1 | 3/2003 | Moore | |
| 6,560,665 B1 | 5/2003 | Resler et al. | |
| 6,714,041 B1 | 3/2004 | Darling et al. | |
| 6,828,823 B1 | 12/2004 | Tsui et al. | |
| 7,030,647 B1* | 4/2006 | White et al. | 326/38 |
| 2001/0015919 A1* | 8/2001 | Kean | 365/200 |

* cited by examiner

*Primary Examiner*—Vibol Tan
(74) *Attorney, Agent, or Firm*—John Kubodera; Lois D. Cartier

(57) ABSTRACT

On-the-fly reconfiguration of a secured CPLD. In one embodiment, a CPLD includes a novel security circuit that provides two different security control signals: an EEPROM/SRAM security signal and an EEPROM security override signal. The EEPROM/SRAM security signal prevents reading from both the EEPROM and the SRAM, and also prevents writing to the EEPROM. The EEPROM security override signal enables reading and writing for the EEPROM even when otherwise disabled by the EEPROM/SRAM security signal, but is active only when a specific set of conditions are met. These conditions can include, for example, the application of a sufficiently long erase pulse to the EEPROM array. Thus, the security on the EEPROM array is overridden only after the configuration data set stored in the EEPROM array has been erased. Reading from the SRAM is not enabled by the EEPROM security override signal. Therefore, the configuration data set is not compromised.

17 Claims, 15 Drawing Sheets

SYSTEMS AND METHODS FOR PROGRAMMING A SECURED CPLD ON-THE-FLY

FIELD OF THE INVENTION

The present invention relates to the area of programmable logic devices. In particular, the present invention relates to systems and methods for reprogramming a complex programmable logic device (CPLD) without halting system operation, when the programming data stored in the CPLD has been secured to prevent the reading or writing of the programming data.

BACKGROUND OF THE INVENTION

Reprogrammable integrated circuits (ICs) provide a great deal of flexibility and control to circuit designers. For example, an in-system programmable (ISP) device can be programmed while installed in an electronic system (i.e., mounted on a circuit board with other components), thereby allowing modifications or upgrades to be performed on a completed product without replacing any hardware. In a complex programmable logic device (CPLD), this reprogrammability is typically provided by an EEPROM (electrically erasable programmable read-only memory) array.

FIG. 1 shows an electronic system 190 that includes a conventional CPLD 100. CPLD 100 comprises a configuration control circuit 110, an EEPROM array 120, and a configurable logic space 130 that includes a programmable interconnect matrix 131 and macrocells 132a–132d. Configuration control circuit 110 is coupled to receive an instruction INST and provide in response a configuration control signal CFG_CTRL that controls the loading of a set of configuration data CFG_DAT into EEPROM array 120. This in turn places interconnect matrix 131 and macrocells 132a–132d into a desired configuration.

The major benefit provided by EEPROM array 120 is the ability to change the functionality of CPLD 100 (and therefore electronic system 190) by reprogramming EEPROM array 120 with new configuration data. FIG. 2a shows a conventional process for this reconfiguration operation as applied to system 190 shown in FIG. 1. In step 210, power is provided to system 190, and in step 220, a set of configuration data (configuration data CFG_DAT shown in FIG. 1) is programmed into EEPROM array 120. Once the programmed data has been verified, system 190 can begin operating with CPLD 100 in a first configuration (configuration A), as indicated in step 230.

To reconfigure CPLD 100, the outputs of CPLD 100 are tri-stated, which halts operation of system 190, as shown in step 240. EEPROM 120 is then reprogrammed and verified with a new set of configuration data in step 250. System 190 is restarted in step 260, resuming operation with CPLD 100 in a new configuration (configuration B) in step 270. Thus, EEPROM 120 allows CPLD 100 to be reconfigured without making any hardware modifications. CPLD 100 therefore can be designated an in-system programmable (ISP) device.

This ISP capability of CPLD 100 provides substantial operational flexibility to electronic system 190. Unfortunately, the conventional reconfiguration process shown in FIG. 2a requires that operation of system 190 be halted (step 240) while EEPROM array 120 is reprogrammed with the new configuration data (step 250). This interruption of system operation is necessitated by the long programming time associated with EEPROM array 120. For a modern EEPROM array in a CPLD, the programming time is roughly equal to 10 ms multiplied by the number of row addresses in the EEPROM array, which can result in programming times of several seconds. The programming interval will only increase as the complexity of the interconnect array and the number of macrocells in the CPLD increase. The overall system downtime during reconfiguration also includes overhead associated with preparing for the EEPROM programming operation and also restarting system operation.

FIG. 2b shows a timing diagram for the initial configuration and subsequent reconfiguration operations described with respect to FIG. 2a, and shows traces for system power (Vdd), operation of system 190, and programming of EEPROM array 120. As shown in FIG. 2b, when system power is first applied at time T0, EEPROM programming commences. Once the programming of EEPROM array 120 is completed at time T1, system 190 can begin operating with CPLD 100 in a first configuration (configuration A). To place CPLD 100 in a different configuration, operation of system 190 is halted at time T2, and reprogramming of EEPROM 120 is performed. At time T3, this reprogramming is completed and system 190 can resume operation, this time with CPLD 100 in a second configuration (configuration B). As indicated in FIG. 2b, the time period between times T0 and T1 corresponds to the "CPLD Configuration at Power-Up" portion of the flow chart shown in FIG. 2a (steps 210 and 220). Similarly, the time period between times T1 and T2 corresponds to step 230, while the time period between times T2 and T3 corresponds to steps 240, 250, and 260 ("CPLD Reconfiguration"). Finally, the portion of the timing diagram after time T3 corresponds to step 270.

As noted previously, the downtime system 190 experienced during the reconfiguration operation from time T2 to time T3 is necessary to allow CPLD 100 to be reconfigured. In a conventional CPLD that follows the IEEE 1532 standard for ISP use, the only way to reconfigure the system is to apply an ISC_ENABLE instruction that halts the system (by tri-stating the CPLD outputs) to allow the new configuration data to be loaded into the EEPROM array. While this type of operational interruption may be acceptable in certain situations, in general it is much more desirable to minimize or eliminate any system downtime.

Accordingly, it is desirable to provide a system and method for reconfiguring a CPLD without interrupting system operation.

A desirable feature that can be included in CPLDs such as CPLD 100 is a "security feature" by means of which the configuration data set stored in EEPROM array 120 is secured from being either read or overwritten. Securing EEPROM array 120 from reading secures the configuration data set stored by the user from being read from the device, e.g., for purposes of copying the design. Securing EEPROM array 120 from writing prevents the accidental overwriting of the stored data, e.g., by inadvertently enabling configuration control circuit 110. Therefore, a security feature is a desirable addition for a CPLD in many applications.

Therefore, it is desirable to provide a system and method for reconfiguring a CPLD having a security feature without interrupting system operation.

SUMMARY OF THE INVENTION

The invention provides a system and method for rapidly reconfiguring a CPLD that includes a security feature. Some modern CPLD architectures, such as those used in the CoolRunner™ family of CPLDs from Xilinx, Inc., incorporate both an EEPROM array and an SRAM array. A set of configuration data is programmed into the EEPROM, which provides non-volatile storage of that configuration data set. During operation of the CPLD, the configuration data set stored in the EEPROM is transferred into the SRAM array, which controls the configuration of the logic elements of the CPLD. In a secured CPLD, the configuration data set includes a security code that, once transferred to the SRAM, prevents the reading or overwriting of the configuration data set. The EEPROM array can then be turned off to minimize device power consumption. The SRAM array in this type of CPLD architecture is sometimes referred to as a "shadow" SRAM array since it reproduces the configuration data set stored in the EEPROM array. Note that the security code is also copied into the shadow SRAM array, where it serves to protect the configuration data set in both EEPROM and SRAM arrays even after the EEPROM has been turned off.

The invention uses the EEPROM and SRAM arrays in this type of CPLD to advantageously allow the configuration of a secured CPLD to be changed so quickly that normal system operation (i.e., operation of the system to perform its intended function) need not be terminated to allow for CPLD reconfiguration. The configuration data set in the SRAM controls the CPLD and allows the device to continue operating, while the data in the EEPROM is erased and a new configuration data set is loaded.

However, in a secured CPLD the security code stored in the SRAM remains active. In known CPLDs, the security code stored in the SRAM prevents the loading of the new configuration data set into the EEPROM until the EEPROM array is erased and the "blank" EEPROM data is loaded into the SRAM. Clearly, this measure would also halt the operation of the CPLD, and therefore of the system. Therefore, the present invention provides systems and methods for overriding the security code stored in the SRAM without compromising the configuration data set, thereby enabling the on-the-fly (OTF) reconfiguration of a secured CPLD.

To enable OTF reconfiguration of a secured CPLD, a CPLD according to one embodiment of the present invention includes a novel security circuit that provides two different security control signals: an EEPROM/SRAM security signal and an EEPROM security override signal. The EEPROM/SRAM security signal can be, for example, similar to the security signal provided in known secure CPLDs. The EEPROM security override signal enables reading and writing for the EEPROM even when otherwise disabled by the EEPROM/SRAM security signal, but is active only when a specific set of conditions are met. In some embodiments, the EEPROM security override signal enables writing to the EEPROM, but does not enable reading from the EEPROM. Therefore, in these embodiments the configuration data stored in the EEPROM cannot be verified after programming.

The conditions required to enable the EEPROM security override can include, for example, the application of an erase pulse to the EEPROM array for at least a predetermined amount of time. Thus, the security on the EEPROM array is overridden only after the configuration data set stored in the EEPROM array has been erased. Reading from the SRAM is not enabled by the EEPROM security override signal. Therefore, the configuration data set is not compromised.

In some embodiments, in order to enable the security override the erase pulse must be of a longer duration than is required to erase the configuration data set stored in the EEPROM array. Thus, in these embodiments a user can choose to erase the EEPROM array with or without enabling the security override.

The invention encompasses a variety of systems and methods that permit the OTF reconfiguration of a secured CPLD under a limited set of circumstances.

The present invention will be more fully understood in view of the following description and drawings.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 3:
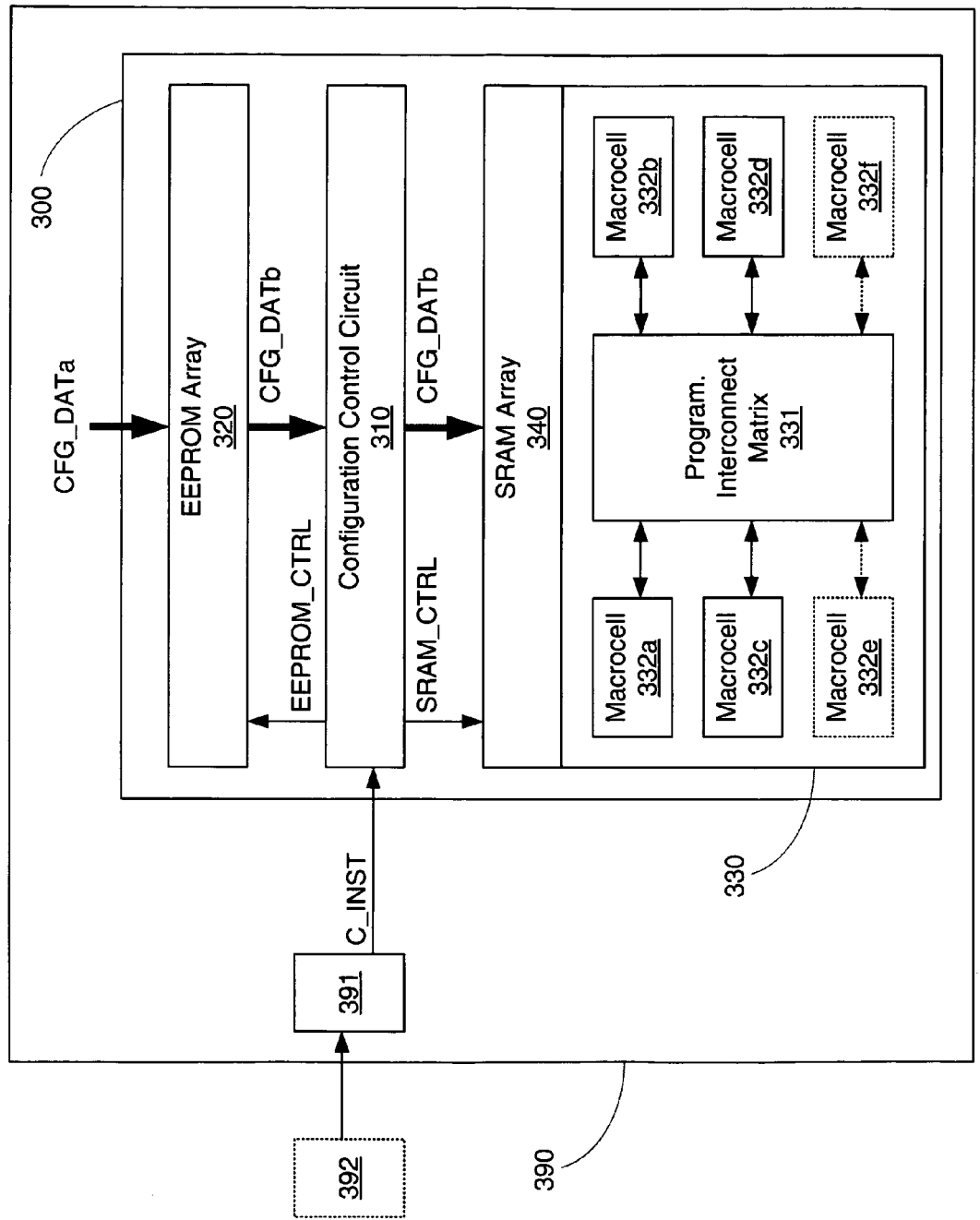
FIG. 3 shows an electronic system that includes a CPLD having a shadow SRAM array.

FIG. 3 shows a diagram of an electronic system 390 that includes a CPLD 300 and an instruction source 391. CPLD 300 comprises a configuration control circuit 310, an EEPROM array 320, a shadow SRAM array 340, and a configurable logic space 330 that includes a programmable interconnect matrix 331 and macrocells 332a–332f. Note that configurable logic space 330 can include any number of macrocells, and macrocells 332e and 332f are depicted using dotted lines to indicate as much.

Configuration control circuit 310 is coupled to receive a configuration instruction C_INST from instruction source 391. According to one embodiment, instruction source 391 can comprise local storage such as a hard drive, a CDROM, or a floppy disk on which instruction C_INST is stored. According to another embodiment, instruction source 391 can comprise a network connection to an optional external database 392 (indicated by the dotted line), external database 392 storing and providing instruction C_INST across a local area network (LAN) or a wide area network (WAN). Note that external database 392 can comprise any type of data storage system, such as a hard drive or optical disk array in a remote computer or mainframe. According to another embodiment, configuration instruction C_INST comprises an IEEE 1149.1 (1993) or IEEE 1532 (2002 draft) instruction.

In response to configuration instruction C_INST, configuration control circuit 310 provides an EEPROM configuration signal EEPROM_CTRL and an SRAM configuration signal SRAM_CTRL to EEPROM array 320 and SRAM array 340, respectively. EEPROM configuration signal EEPROM_CTRL causes a set of configuration data CFG_DATa to be programmed into EEPROM array 320. Meanwhile, SRAM configuration signal SRAM_CTRL causes a set of configuration data CFG_DATb to be loaded into SRAM array 340 from EEPROM array 320. Configuration control circuit 310 can include sense amplifiers (not shown) to ensure proper transfer of this configuration data. Once programmed into SRAM array 340, configuration data CFG_DATb defines the configuration of interconnect matrix 331 and macrocells 332a–332f of configurable logic space 330.

By adjusting the relative timing of these two operations (programming EEPROM array 320 and transferring configuration data into SRAM array 340), configuration instruction C_INST can control the manner in which CPLD 300 is configured or reconfigured. For example, to initially configure CPLD 300, configuration data set CFG_DATa can be programmed into EEPROM array 320, and immediately thereafter that stored configuration data can be read into SRAM array 340 as configuration data set CFG_DATb. This places CPLD 300 in a first configuration.

To reconfigure CPLD 300, instruction C_INST can program a new configuration data set CFG_DATa into EEPROM array 320 far in advance of when that data is to be transferred to SRAM array 340. By performing the relatively time-consuming EEPROM programming operation in the background while CPLD 300 is operating in its original configuration, the actual reconfiguration of CPLD 300 only involves transferring the new configuration data from EEPROM array 320 into SRAM array 340, a process requiring only microseconds to complete.

Because this data transfer occurs so rapidly, the reconfiguration of CPLD 300 can be effectively transparent to system 390. This is due to the fact that even though the outputs of CPLD 300 would typically be tri-stated (or clamped to a specified state) during loading of the new configuration data set into SRAM array 340, the few microseconds required to complete this operation would generally not interfere with normal (functional) operation of system 390. Because this reconfiguration operation can actually be incorporated into the flow of normal system operation, it is designated an "on the fly" (OTF) reconfiguration. In contrast, conventional methods for reconfiguring CPLD 300 all include the lengthy EEPROM programming operation as part of a continuous reconfiguration sequence, and therefore require that normal (functional) system operation be terminated while a reconfiguration operation is performed.

Figure 4A:
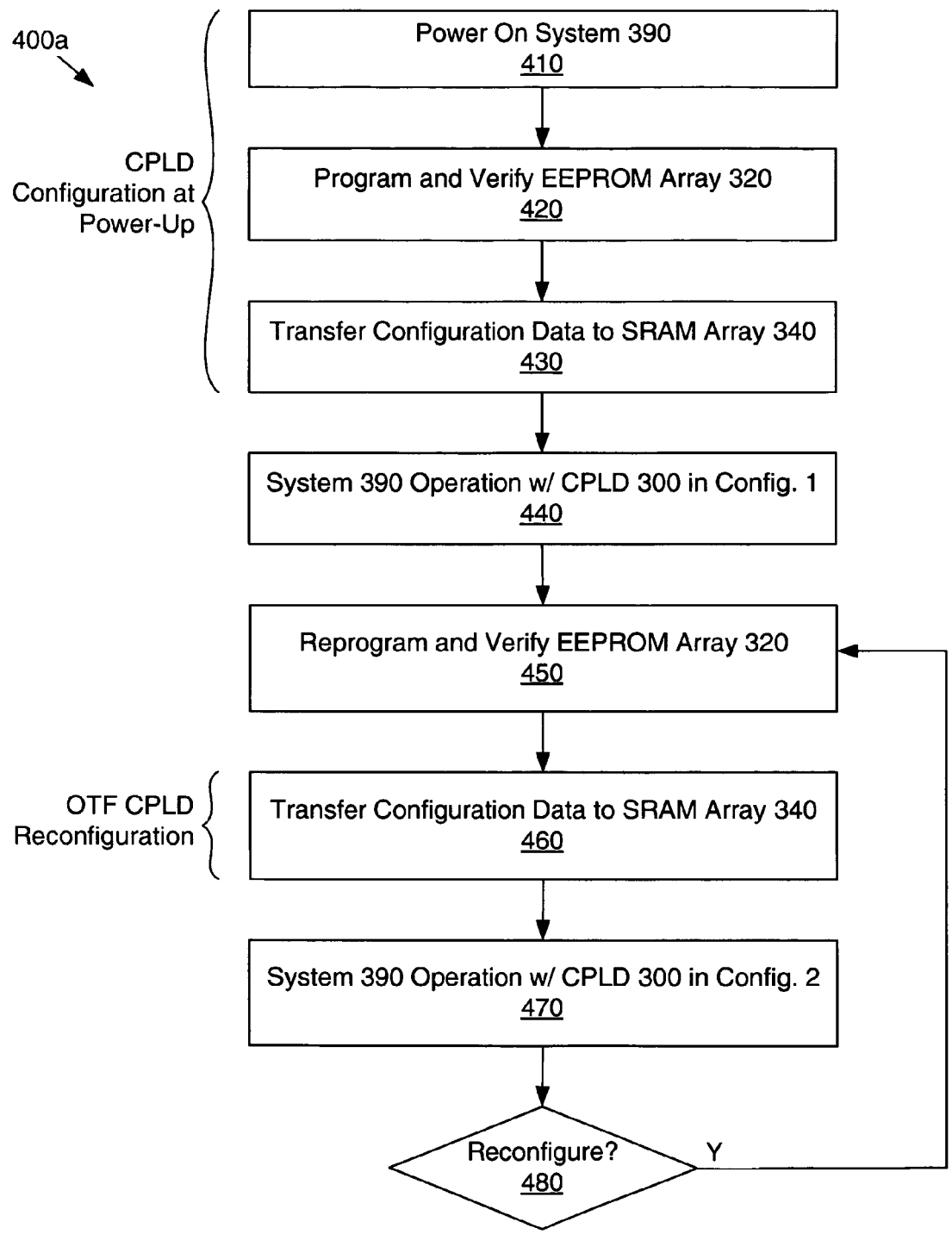
FIG. 4a shows a flow diagram for an on-the-fly (OTF) CPLD reconfiguration operation.

FIG. 4a shows a flow diagram 400a that describes the initial configuration and subsequent OTF reconfiguration of CPLD 300. In step 410, power is provided to system 390, and in step 420, a first set of configuration data (configuration data CFG_DATa shown in FIG. 3) is programmed into EEPROM array 320. Once the programmed data has been verified, the configuration data can be transferred to shadow SRAM array 340, as indicated in step 430. System 390 can then begin operating with CPLD 300 in a first configuration (configuration 1), as indicated in step 440.

While system 390 is operating with CPLD 300 in the first configuration, EEPROM array 320 is reprogrammed with a second set of configuration data, as indicated in step 450. Then, to perform an OTF reconfiguration of CPLD 300, this new set of configuration data is transferred from EEPROM array 320 to SRAM array 340 in step 460. The timing of this configuration data transfer operation can be specified in various ways, including being defined by instruction C_INST shown in FIG. 3, or being executed in response to a user input. In any case, once the second set of configuration data has been transferred into SRAM array 340, CPLD 300 operates in a new configuration (configuration 2), as indicated in step 470. Thus, the reconfiguration of CPLD 300 takes place without halting system operation. Subsequent OTF reconfigurations can be performed by reprogramming EEPROM array 320 in the background and transferring that new configuration data to SRAM array 340 at a desired time, as indicated in step 480.

Figure 4B:
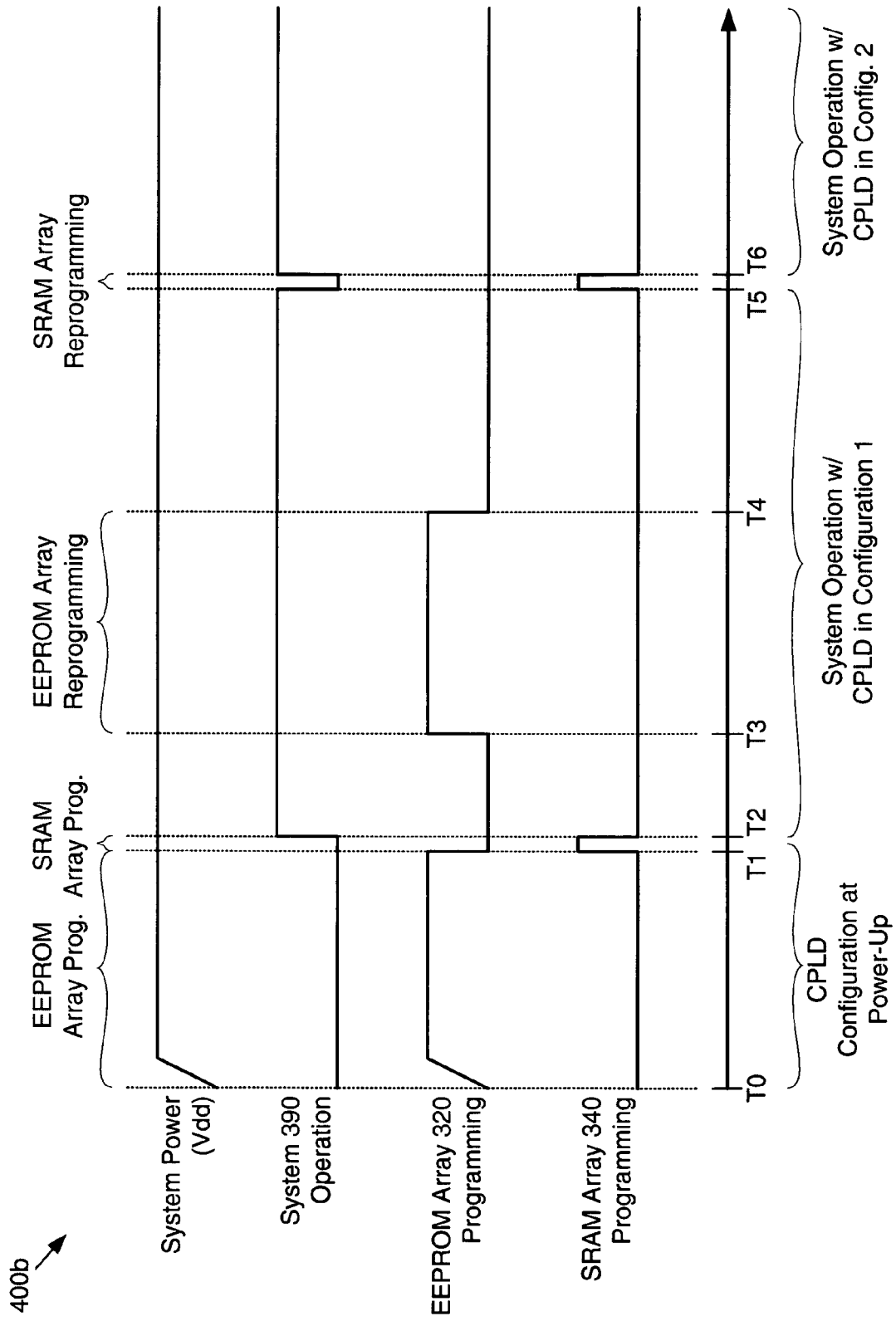
FIG. 4b shows a timing diagram for an OTF CPLD reconfiguration operation.

FIG. 4b shows a timing diagram 400b for flow diagram 400a shown in FIG. 4a, and shows traces for system power (Vdd), system 390 operation, EEPROM array 320 programming, and SRAM array 340 programming (note that the pulse widths for the EEPROM array and SRAM array programming traces are not drawn to scale). As shown in FIG. 4b, when system power is first applied at time T0, programming of EEPROM array 320 with a first set of configuration data commences. Once EEPROM array 320 is fully programmed (at time T1), SRAM array 340 can be programmed with the configuration data stored in EEPROM array 320. Upon completion of this data transfer operation (at time T2), system 390 can begin operating with CPLD 300 in a first configuration (configuration 1). As indicated, the time period between times T0 and T2 corresponds to the "CPLD Configuration at Power-Up" portion of flow diagram 400a (steps 410–430).

While system 390 is operating with CPLD 300 in configuration 1 (from time T2 to time T5), EEPROM array 320 is reprogrammed between times T3 and T4. Note that this background reprogramming of EEPROM array 320 does not affect the operation of system 390 since the configuration of CPLD 300 is only controlled by SRAM array 340. Then, at a desired time T5, the new configuration data set in EEPROM array 320 is loaded into SRAM array 340, so that from time T6 onward, system 390 operates with CPLD 300 in a new configuration (configuration 2). The period of reconfiguration between times T5 and T6 is short enough that the transition from configuration 1 to configuration 2 effectively occurs without interruption to the operation of system 390. In this manner, OTF reconfiguration can be performed on CPLD 300.

As noted previously, once the background reprogramming of EEPROM array 320 is completed, CPLD 300 can be reconfigured at any desired time. In certain situations, it may be desirable to have system 390 operate with CPLD 300 in a first configuration until system power is removed, and then resume operation in a second configuration when power is returned.

Figure 4C:
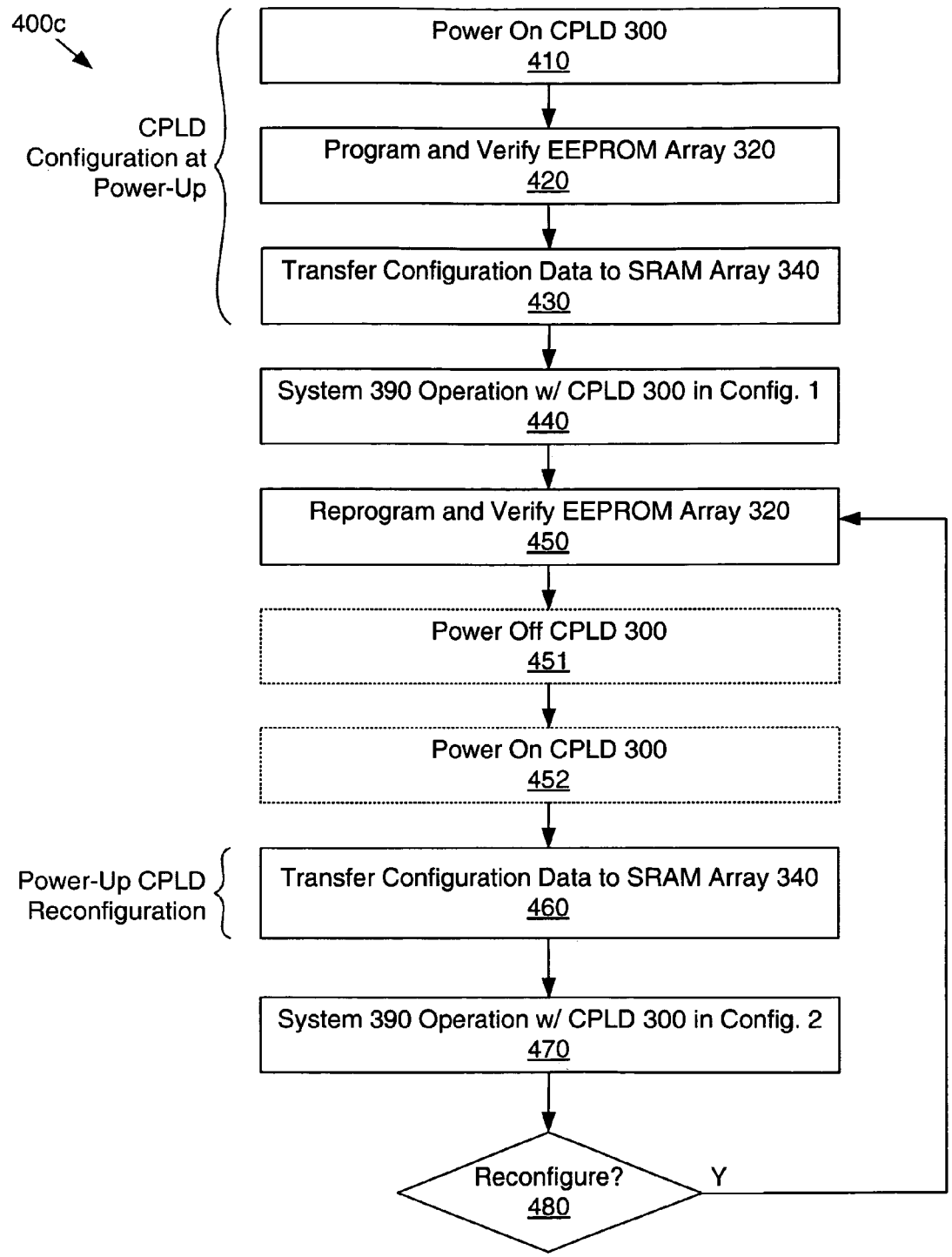
FIG. 4c shows a flow diagram for a power-up CPLD reconfiguration operation.

FIG. 4c shows a flow diagram 400c that describes this type of "power-up" reconfiguration of CPLD 300. Flow diagram 400c is substantially similar to flow diagram 400a shown in FIG. 4a, except for the addition of optional power down step 451 and power on step 452. Therefore, after EEPROM array 320 is reprogrammed in step 450, system 390 can be powered down (step 451), halting system operation and purging the configuration data from SRAM array 340 (because it is a volatile memory array). Thus, when power is reapplied to system 390 (step 452), the new configuration data set stored in EEPROM array 320 is loaded into SRAM array 340 (step 460). Therefore, system 390 resumes operation with CPLD 300 in a new configuration (configuration 2), as indicated in step 470. Subsequent OTF reconfiguration operations can be performed (skipping power down and power up steps 451 and 452, respectively), as indicated by step 480.

Figure 4D:
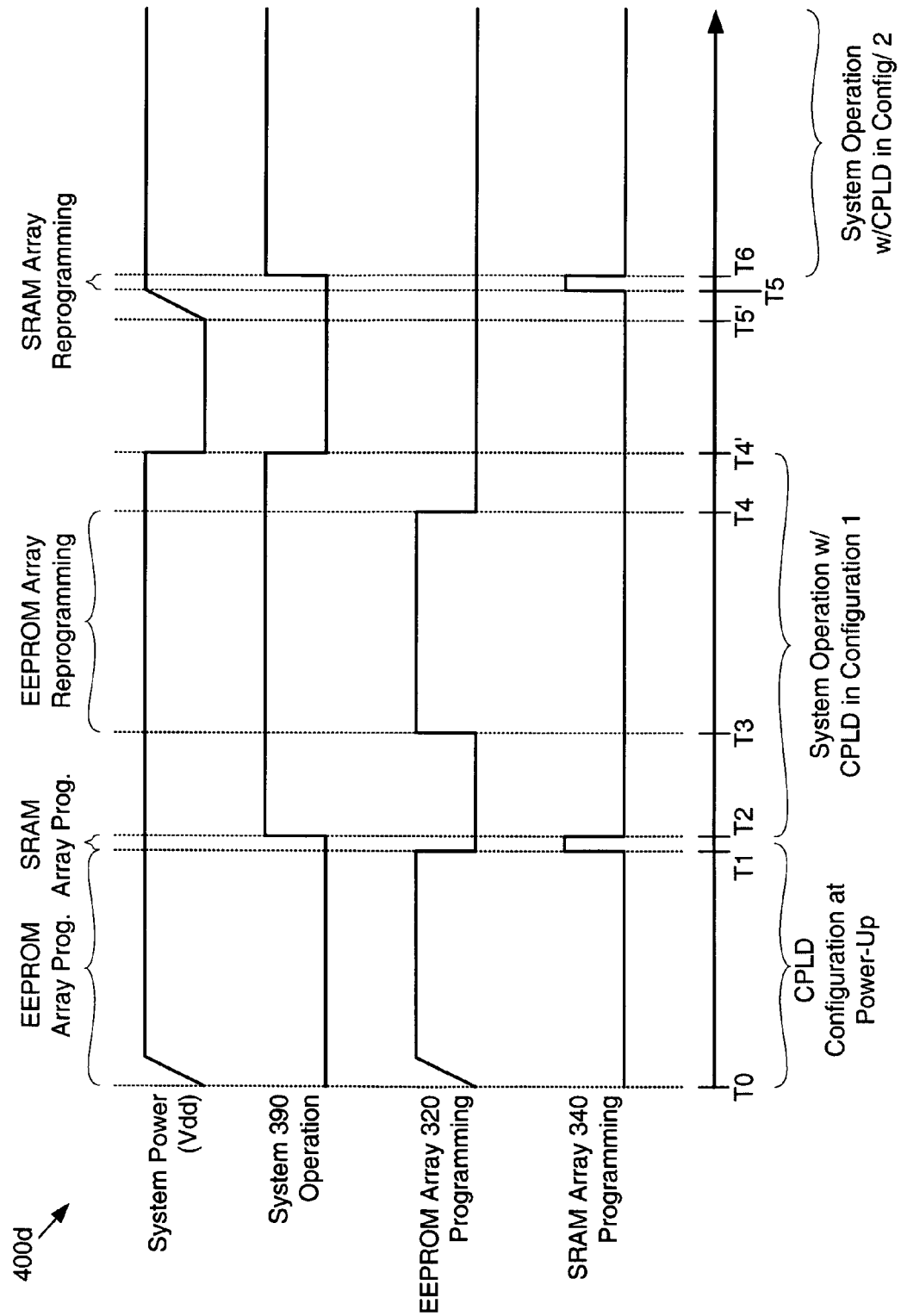
FIG. 4d shows a timing diagram for a power-up CPLD reconfiguration operation.

FIG. 4d shows a timing diagram 400d for flow diagram 400c shown in FIG. 4c, and shows traces for system power (Vdd), system 390 operation, EEPROM array 320 programming, and SRAM array 340 programming (note that the pulse widths for the EEPROM array and SRAM array programming traces are not drawn to scale). From the time system power is first applied at time T0 until EEPROM array 320 is reprogrammed with new configuration data at time T4 (while system 390 is operating with CPLD 300 in configuration 1), timing diagram 400d is substantially similar to timing diagram 400b shown in FIG. 4b. However, rather than depicting an OTF reconfiguration such as shown in timing diagram 400b, timing diagram 400d shows system 390 being powered down at time T4'. Then, at a desired time T5', power is reapplied to system 390, and the configuration data previously stored in EEPROM array 320 is loaded into SRAM array 340 from time T5 to time T6. Once again, due to the high speed with which the configuration data from EEPROM 320 can be loaded into SRAM array 340, system 390 can almost immediately begin operation with CPLD 300 in configuration 2. In this manner, the invention allows a rapid power-up reconfiguration to be performed on CPLD 300.

Figure 5:
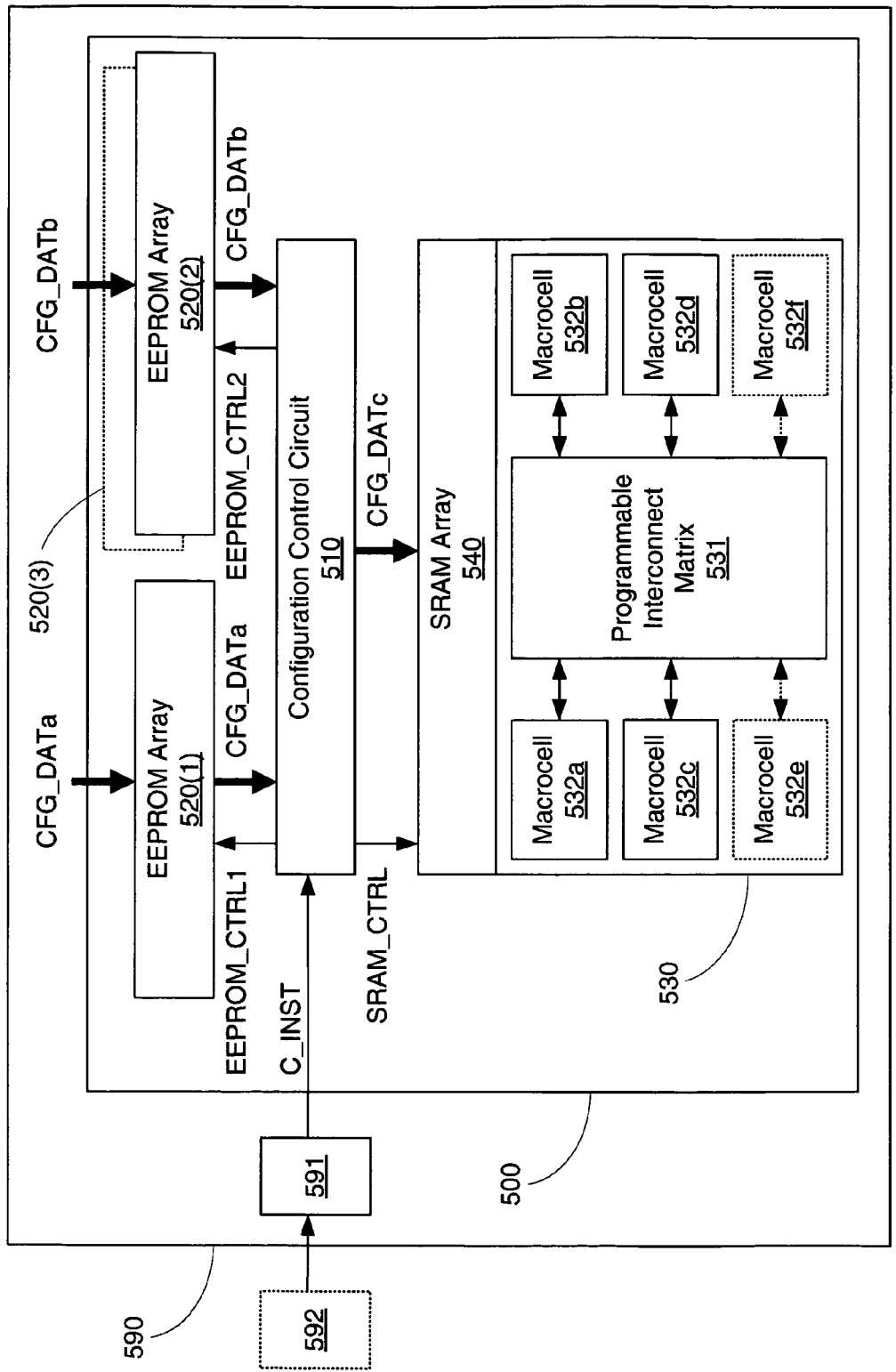
FIG. 5 shows an electronic system that includes a CPLD having a shadow SRAM array and multiple EEPROM arrays.

A CPLD that includes a shadow SRAM array can comprise multiple EEPROM arrays, each capable of holding a different set of configuration data. FIG. 5 shows a diagram of an electronic system 590 including a CPLD 500 and an instruction source 591. CPLD 500 comprises a configuration control circuit 510, EEPROM arrays 520(1)–520(3), a shadow SRAM array 540, and a configurable logic space 530 that includes a programmable interconnect matrix 531 and macrocells 532a–532f. Note that configurable logic space 530 can include any number of macrocells, and macrocells 532e and 532f are depicted using dotted lines to indicate as much. Note further that even though the operation of CPLD 500 will be described with respect to only EEPROM arrays 520(1) and 520(2) for clarity, EEPROM array 520(3) is depicted using dotted lines to indicate that any number of EEPROM arrays could be included in CPLD 500.

Configuration control circuit 510 is coupled to receive a configuration instruction C_INST from instruction source 591. According to one embodiment, instruction source 591 can comprise local storage such as a hard drive, a CDROM, or a floppy disk on which instruction C_INST is stored. According to another embodiment, instruction source 591 can comprise a network connection to an optional external database 592 (indicated by the dotted line), external database 592 storing and providing instruction C_INST across a local area network (LAN) or a wide area network (WAN). Note that external database 592 can comprise any type of data storage system, such as a hard drive or optical disk array in a remote computer or mainframe. According to another embodiment, configuration instruction C_INST can comprise an IEEE 1149.1 or IEEE 1532 instruction.

In response to configuration instruction C_INST, configuration control circuit 510 provides EEPROM configuration signals EEPROM_CTRL1 and EEPROM_CTRL2 to EEPROM arrays 520(1) and 520(2), respectively, and provides an SRAM configuration signal SRAM_CTRL to SRAM array 540. EEPROM configuration signals EEPROM_CTRL1 and EEPROM_CTRL2 cause configuration data sets CFG_DATa and CFG_DATb, respectively, to be programmed into EEPROM arrays 520(1) and 520(2), respectively. Meanwhile, SRAM configuration signal SRAM_CTRL causes a set of configuration data CFG_DATc, representing the configuration data stored in either EEPROM array 520(1) or 520(2), to be loaded into SRAM array 540. Configuration control circuit 510 can include sense amplifiers (not shown) to ensure proper transfer of this configuration data. Once programmed into SRAM array 540, configuration data CFG_DATc sets the configuration of interconnect matrix 531 and macrocells 532a–532f of configurable logic space 530.

By adjusting the relative timing of these operations (programming EEPROM arrays 520(1) and 520(2) and transferring configuration data into SRAM array 540), configuration instruction C_INST can control the manner in which CPLD 500 is configured or reconfigured. For example, to initially configure CPLD 500, EEPROM array 520(1) could be programmed and that stored configuration data could be immediately read into SRAM array 540. Alternatively, CPLD 500 could be initially configured by programming EEPROM array 520(2) and transferring that configuration data into SRAM array 540. Also, both EEPROM arrays 520(1) and 520(2) could be programmed (with different sets of configuration data) and configuration instruction C_INST could select either one to provide the initial configuration data to SRAM array 540.

Once CPLD 500 is placed in this initial configuration (first configuration), the multi-EEPROM array architecture of CPLD 500 enables rapid switching between various configurations. Different sets of configuration data can be programmed into EEPROM arrays 520(1) and 520(2), so that a desired configuration can be applied by simply loading the configuration data from a particular EEPROM array into SRAM array 540. Once again, the time-consuming EEPROM programming can be performed in the background, thereby allowing the actual reconfiguration of CPLD 500 to be performed in the short time required to program SRAM array 540. As described previously with respect to FIG. 3, the timing of this configuration data transfer operation can be specified in various ways, including being defined by instruction C_INST shown in FIG. 500, or being executed in response to a user input. As described previously with respect to CPLD 300 shown in FIG. 3, this microsecond-range reconfiguration time allows CPLD 500 to be reconfigured on the fly (i.e., without terminating normal operation of system 590).

Figure 6A:
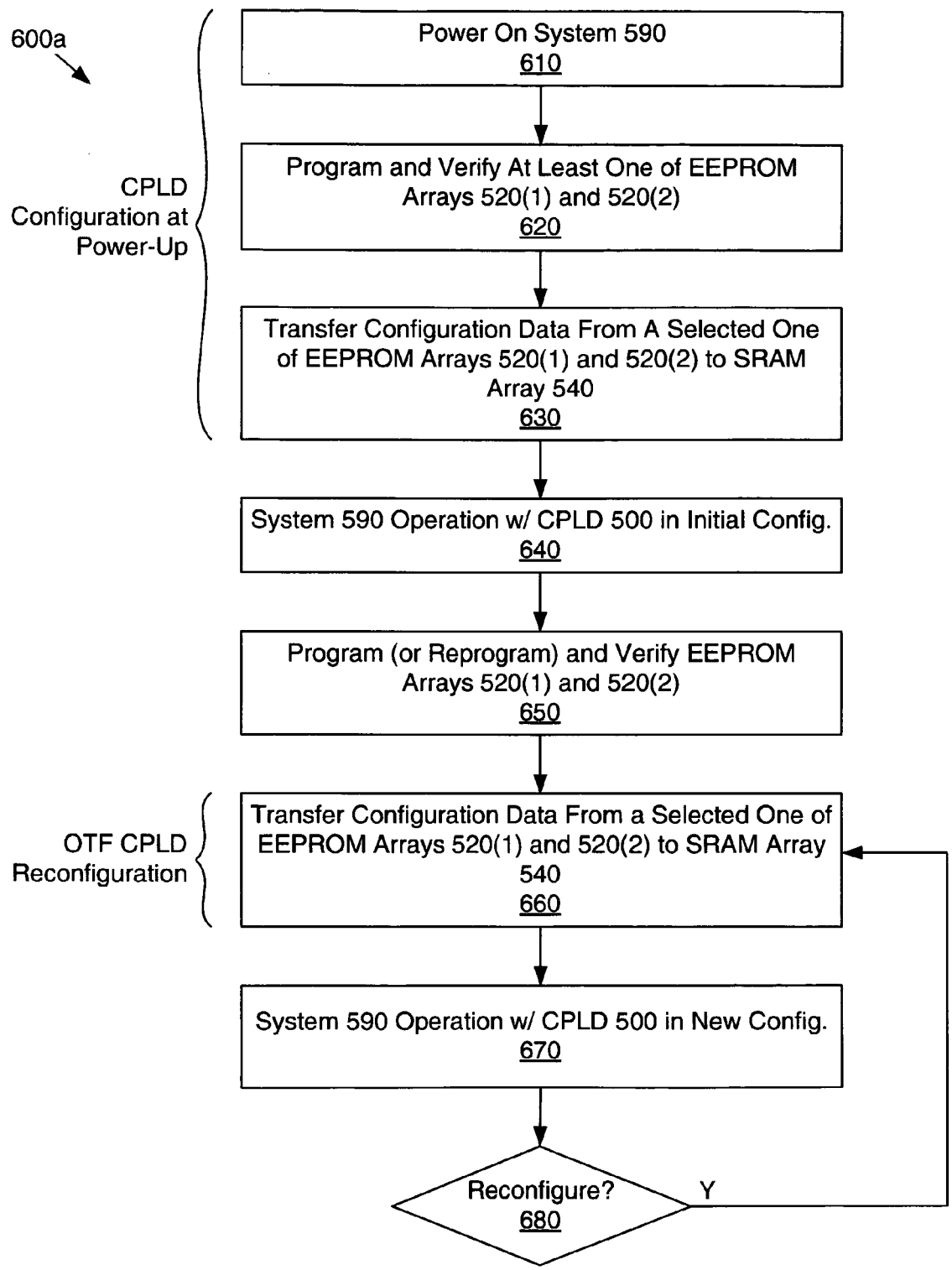
FIG. 6a shows a flow diagram for an OTF CPLD reconfiguration operation for a CPLD having multiple EEPROM arrays.

FIG. 6a shows a flow diagram 600a that describes the initial configuration and subsequent OTF reconfiguration of CPLD 500. In step 610, power is provided to system 590, and in step 620, either or both of EEPROM arrays 520(1) and 520(2) are programmed with configuration data sets CFG_DATa and CFG_DATb, respectively. Once the programmed data has been verified, the configuration data from a selected one of EEPROM arrays 520(1) and 520(2) can be transferred to shadow SRAM array 540, as indicated in step 630. System 590 can then begin operating with CPLD 500 in an initial configuration, as indicated in step 640.

While system 590 is operating with CPLD 500 in the first configuration, one or both of EEPROM arrays 520(1) and 520(2) can be programmed or reprogrammed with new configuration data, as indicated in step 650. Note that if both EEPROM arrays 520(1) and 520(2) were programmed during the initial power-up sequence (step 620), then neither EEPROM array might be programmed in step 650. Then, to perform an OTF reconfiguration of CPLD 500, new configuration data from either EEPROM array 520(1) or 520(2) is transferred to SRAM array 540 in step 660, allowing CPLD 500 to operate in a new configuration, as indicated in step 670. As indicated by step 680, subsequent OTF reconfigurations of CPLD 500 can be performed simply by loading into SRAM array 540 the configuration data from the appropriate one of EEPROM arrays 520(1) and 520(2).

Figure 6B:
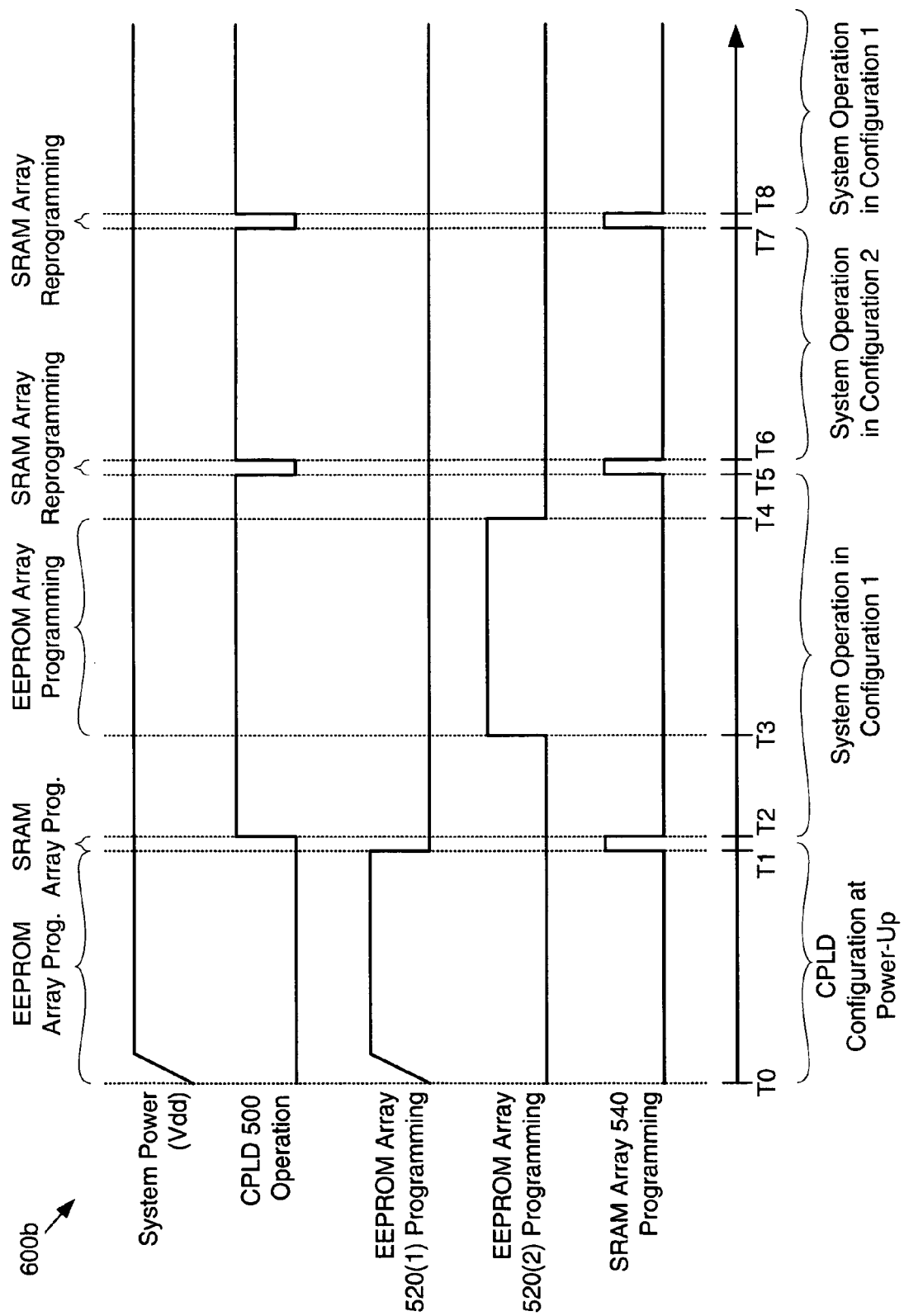
FIG. 6b shows a timing diagram for an OTF CPLD reconfiguration operation for a CPLD having multiple EEPROM arrays.

FIG. 6b shows an example timing diagram 600b for flow diagram 600a shown in FIG. 6a. Timing diagram 600b is substantially similar to timing diagram 400b shown in FIG. 4b, except that instead of a single EEPROM array programming trace, timing diagram 600b includes traces for programming EEPROM array 520(1) and 520(2) (note that the pulse widths for the EEPROM array and SRAM array programming traces are not drawn to scale). Timing diagram 600b depicts a sequence of operations in which EEPROM array 520(1) is programmed with a first set of configuration data when CPLD 500 is first powered on (time T0 to time T1), and this data is immediately copied into SRAM array 540 (time T1 to time T2) to place CPLD 500 in its initial configuration (configuration 1). Then, while system 590 is operating with CPLD 500 in this initial configuration (time T2 to time T5), a second set of configuration data is programmed into EEPROM array 520(2) (time T3 to time T4). CPLD 500 can then be reconfigured on the fly by transferring this second set of configuration data in EEPROM array 520(2) into SRAM array 520 (time T5 to time T6). Subsequent OTF reconfiguration(s) of CPLD 500 can be performed by transferring the configuration data from a selected one of EEPROM arrays 520(1) and 520(2) into SRAM array 540 (e.g., time T7 to time T8). In this manner, the invention allows a CPLD to be rapidly switched between multiple configurations without terminating normal operation of system 590.

As previously described, some CPLDs include a "security feature" by means of which the stored configuration data set is secured from being either read or overwritten. The security feature in a known CPLD is enabled by storing a predetermined value (the "security code") in a given memory location in the SRAM array. The security code can be as simple as a single bit value, or a more complicated value that is decoded to determine the security status of the programmed device.

Figure 1:
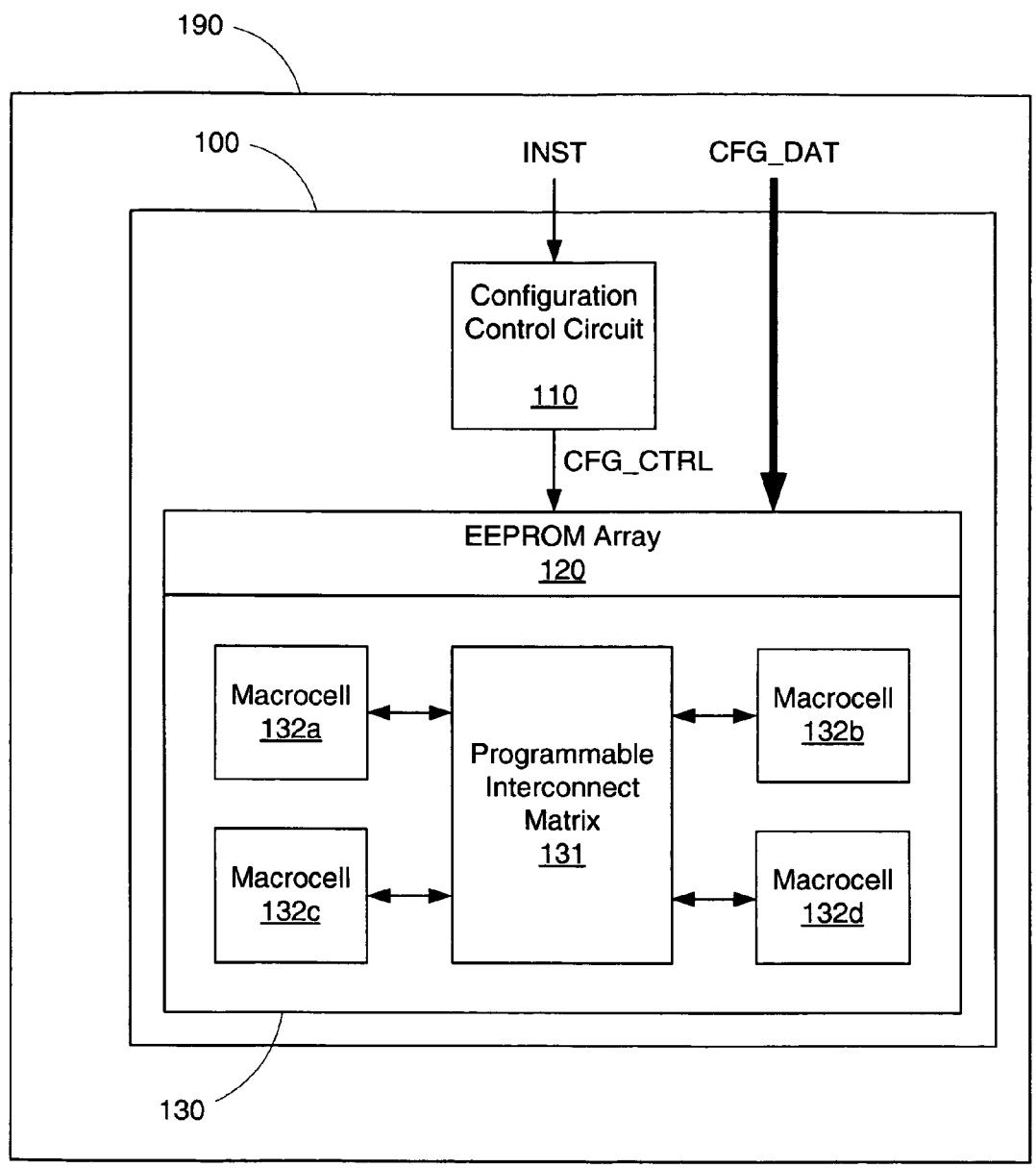
FIG. 1 shows an electronic system that includes a conventional CPLD.
Figure 2A:
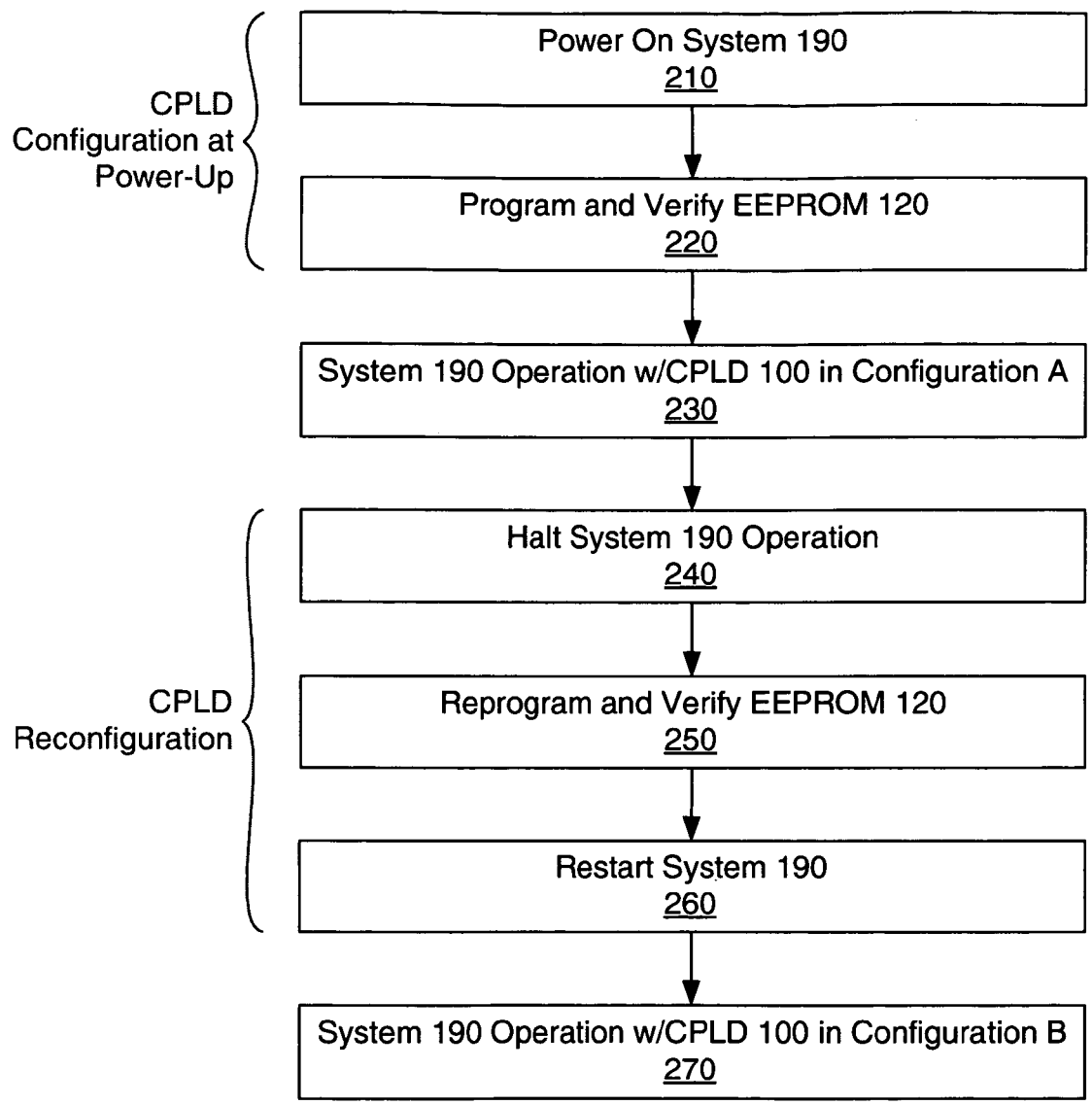
FIG. 2a shows a flow diagram for a conventional CPLD reprogramming operation.
Figure 2B:
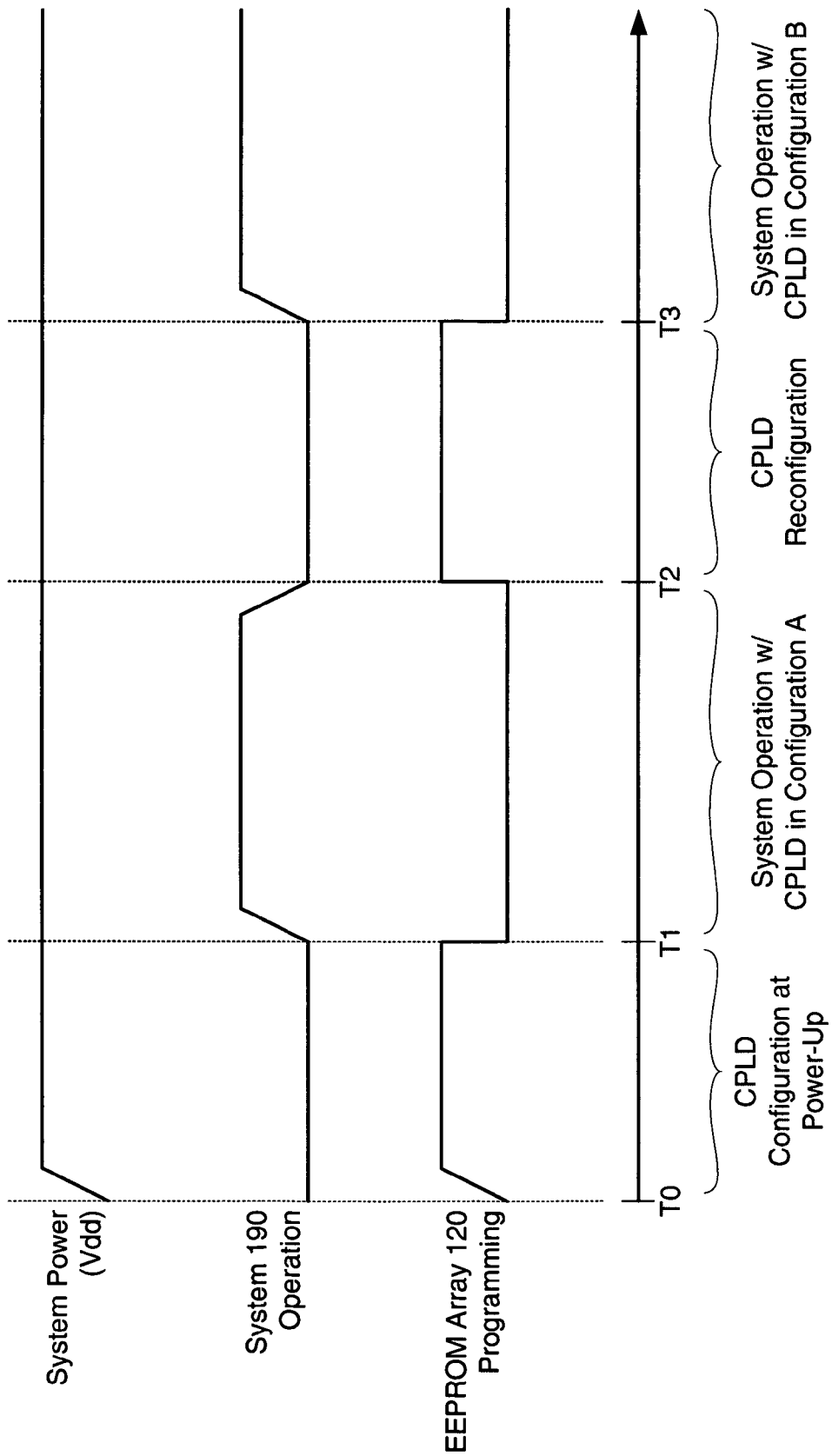
FIG. 2b shows a timing diagram for a conventional CPLD reprogramming operation.

In a CPLD that includes an EEPROM array but no shadow SRAM array (e.g., see FIG. 1), when the security code is present in a specified location in the EEPROM array the security feature is enabled and the EEPROM array can be neither read from nor written to. However, the EEPROM array can still be erased. Erasing the EEPROM array also erases the security code, thereby allowing the user to write new configuration data to the EEPROM array. Of course, when the EEPROM array is erased the CPLD ceases to operate.

In a CPLD that includes both an EEPROM array and a shadow SRAM array (e.g., see FIGS. 3 and 5), when the correct security code is present in a specified location in the SRAM array the security feature is enabled and the configuration data set in the EEPROM array is protected from both reading and writing. (The presence of the security code in the EEPROM array typically does not protect the data in the EEPROM array, or it would prevent the verification of the EEPROM data after loading.) The configuration data set in the SRAM array is protected from reading, but can be overwritten by data from the EEPROM array by applying the appropriate instruction to the configuration control circuit. The EEPROM array can still be erased. Erasing the EEPROM array erases the security code from the EEPROM array, but the shadow copy of the security code remains in the SRAM array. Therefore, the shadow copy of the security code prevents the reprogramming of the EEPROM.

To overcome this limitation, a CPLD according to one embodiment of the present invention includes a novel security circuit that provides two different security control signals: an EEPROM/SRAM security signal and an EEPROM security override signal. The EEPROM/SRAM security signal can be, for example, similar to the security signal provided in known secure CPLDs, e.g., in the CoolRunner™ family of CPLDs from Xilinx, Inc. The EEPROM security override signal enables reading and writing for the EEPROM even when otherwise disabled by the EEPROM/SRAM security signal, but only when a specific set of conditions are met. These conditions can include, for example, the application of an erase pulse to the EEPROM array for at least a predetermined amount of time. Thus, the security on the EEPROM array is overridden only after the configuration data set stored in the EEPROM array has been erased. Reading from the SRAM is not enabled by the EEPROM security override signal. Therefore, the configuration data set is not compromised.

In some embodiments, in order to enable the security override the erase pulse must be of a longer duration than is required to erase the configuration data set stored in the EEPROM array. Thus, in these embodiments a user can choose to erase the EEPROM array with or without enabling the security override.

Figure 7:
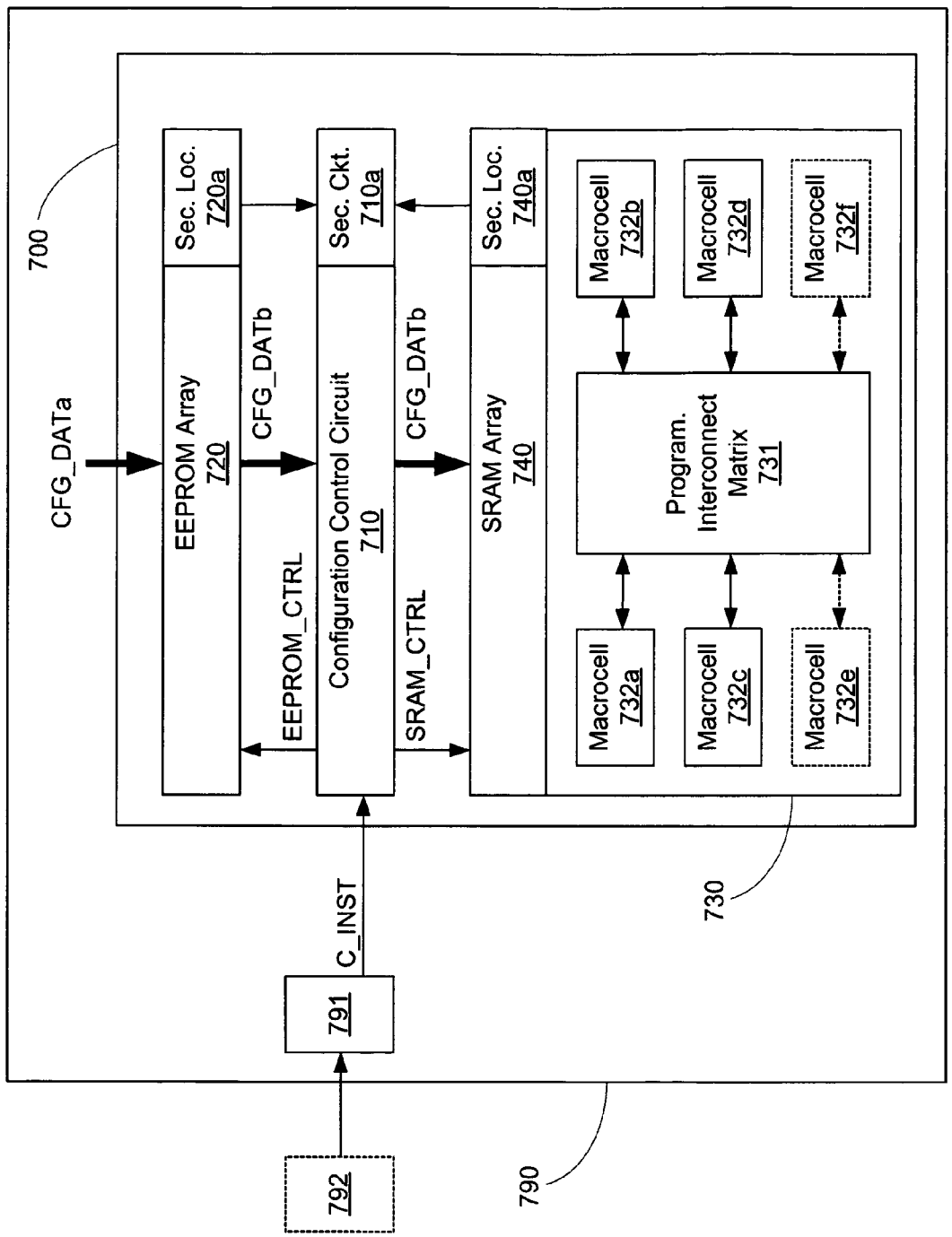
FIG. 7 shows an electronic system that includes a CPLD having both a shadow SRAM array and a security feature.

FIG. 7 shows a diagram of an electronic system 790 that includes a secured CPLD 700 and an instruction source 791. CPLD 700 is similar to CPLD 300 of FIG. 3, and comprises a configuration control circuit 710, an EEPROM array 720, a shadow SRAM array 740, and a configurable logic space 730 that includes a programmable interconnect matrix 731 and macrocells 732a–732f. Note that configurable logic space 730 can include any number of macrocells, and macrocells 732e and 732f are depicted using dotted lines to indicate as much.

Configuration control circuit 710, instruction source 791, optional external database 792, EEPROM array 720, SRAM array 740, and configurable logic space 730 behave in a manner substantially similar to that described above with relation to configuration control circuit 310, instruction source 391, optional external database 392, EEPROM array 320, SRAM array 340, and configurable logic space 330.

However, configuration control circuit 710 differs from configuration control circuit 310 of FIG. 3 by including a security circuit 710a. EEPROM array 720 includes a security location 720a where a security code can be stored. SRAM array 740 also includes a security location 740a to which the security code stored in EEPROM security location 720a is loaded as part of configuration data set CFG_DATb. When the correct security code is stored in security location 740a of SRAM array 740, security circuit 710a prevents the reading of data from either EEPROM array 720 or SRAM array 740. Security circuit 710a also controls the writing of data to EEPROM array 720, preventing the writing of new data to the EEPROM array when the correct security code is present in location 740a of SRAM 740.

Because the presence of the correct security code in location 740a prevents the writing of a new configuration data set to EEPROM array 720, unless special provision is made the security circuit will also prevent OTF reconfiguration of CPLD 700. Therefore, to enable OTF reconfiguration of CPLD 700, security circuit 710a provides a security override function. Under a certain set of limited circumstances, a security override signal removes the security limitation from EEPROM array 720, thereby enabling the writing of a new configuration data set to EEPROM array 720 and (optionally) the subsequent reading from EEPROM array 720 to verify the programmed data. These limited circumstances can include, for example, the application of an erase pulse to EEPROM array 720, the erase pulse being long enough to ensure the erasure of the configuration data set stored in EEPROM array 720. Therefore, removing the security limitation from EEPROM array 720 does not render the configuration data set vulnerable to copying by a third party. The security override signal does not remove the security limitation from SRAM array 740, so the configuration data set stored in SRAM array 740 is also secure.

Figure 8:
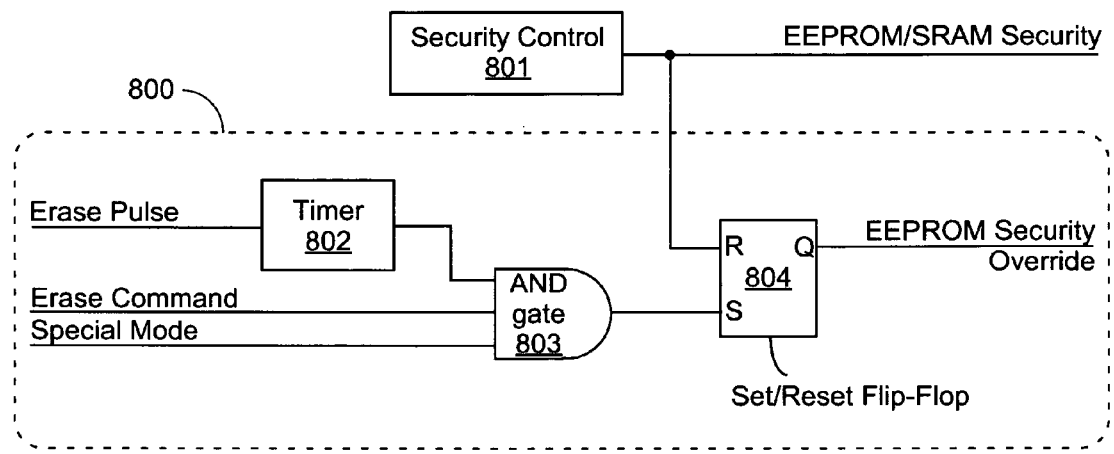
FIG. 8 shows an exemplary security circuit that can be included in the CPLD of FIG. 7 to enable OTF configuration for the electronic system of FIG. 7.

FIG. 8 illustrates one embodiment of security circuit 710a of FIG. 7. Security circuit 710a can be implemented in many different ways, as will be apparent to those of skill in the relevant arts after perusal of the present specification and drawings. Therefore, the circuit illustrated in FIG. 8 is purely exemplary.

The security circuit of FIG. 8 includes a security control circuit 801, a timer circuit 802, an AND gate 803, and a set/reset flip-flop 804. Security control circuit 801 can be the same, for example, as security control circuits presently included in commercially available CPLDs, such as the CoolRunner™ family of CPLDs from Xilinx, Inc. The EEPROM/SRAM security signal provided by security control circuit 801 inhibits the writing of data to EEPROM array 720 (see FIG. 7), and the reading of data from either EEPROM array 720 or SRAM array 740.

In addition to security control circuit 801, the circuit of FIG. 8 includes novel circuitry 800, which provides the EEPROM security override signal. The EEPROM security override signal is active only in a limited set of circumstances. In the pictured embodiment, these circumstances require that: an erase pulse must be applied to EEPROM 720 for at least a predetermined amount of time; an erase command must be applied to the CPLD; and the CPLD must be in a special predefined mode. The duration of the erase pulse is determined by applying the EEPROM erase pulse signal to an enable terminal of timer circuit 802. Timer circuit 802 can be any known timer implementation. The erase command signal can be the same erase command signal applied to EEPROM array 720 to enable the erasure of data from the EEPROM array. The special mode can be set, for example, by supplying the appropriate instruction via instruction C_INST and configuration control circuit 710.

In some embodiments, the duration of the erase pulse required to enable the EEPROM security override is longer than the duration normally used to erase data from the EEPROM. This condition increases the level of certainty that the data previously stored in the EEPROM array has been completely erased and security of the data has not been compromised. Further, the extra-long erase pulse required to enable the security override allows a CPLD user to selectively erase the EEPROM array with or without enabling the security override, as desired. This option can be useful, for example, in embodiments where no special mode is supplied for performing a security override erase.

When all three of the required conditions have been met, AND gate 803 supplies an active set signal to the set terminal of set/reset flip-flop 804. Flip-flop 804 behaves as follows. When an active security code is programmed into security location 740a (see FIG. 7), security control circuit 801 provides an active EEPROM/SRAM security signal (e.g., a high signal in the pictured embodiment). Flip-flop 804 is reset, and the EEPROM security override signal goes inactive (e.g., low). Only when all three conditions are met does the output of AND gate 803 go high, setting flip-flop 804. The EEPROM security override signal goes high, overriding the read and write protection on EEPROM array 720. In another embodiment, the EEPROM/SRAM security signal and the EEPROM security override signal are active-low signals, and the set and reset terminals of flip-flop 804 are reversed.

In other embodiments (not shown), different and/or additional conditions are set for enabling the EEPROM security override signal. These embodiments can be implemented by using a different embodiment of security circuit 710a in the CPLD shown in FIG. 7.

Figure 9A:
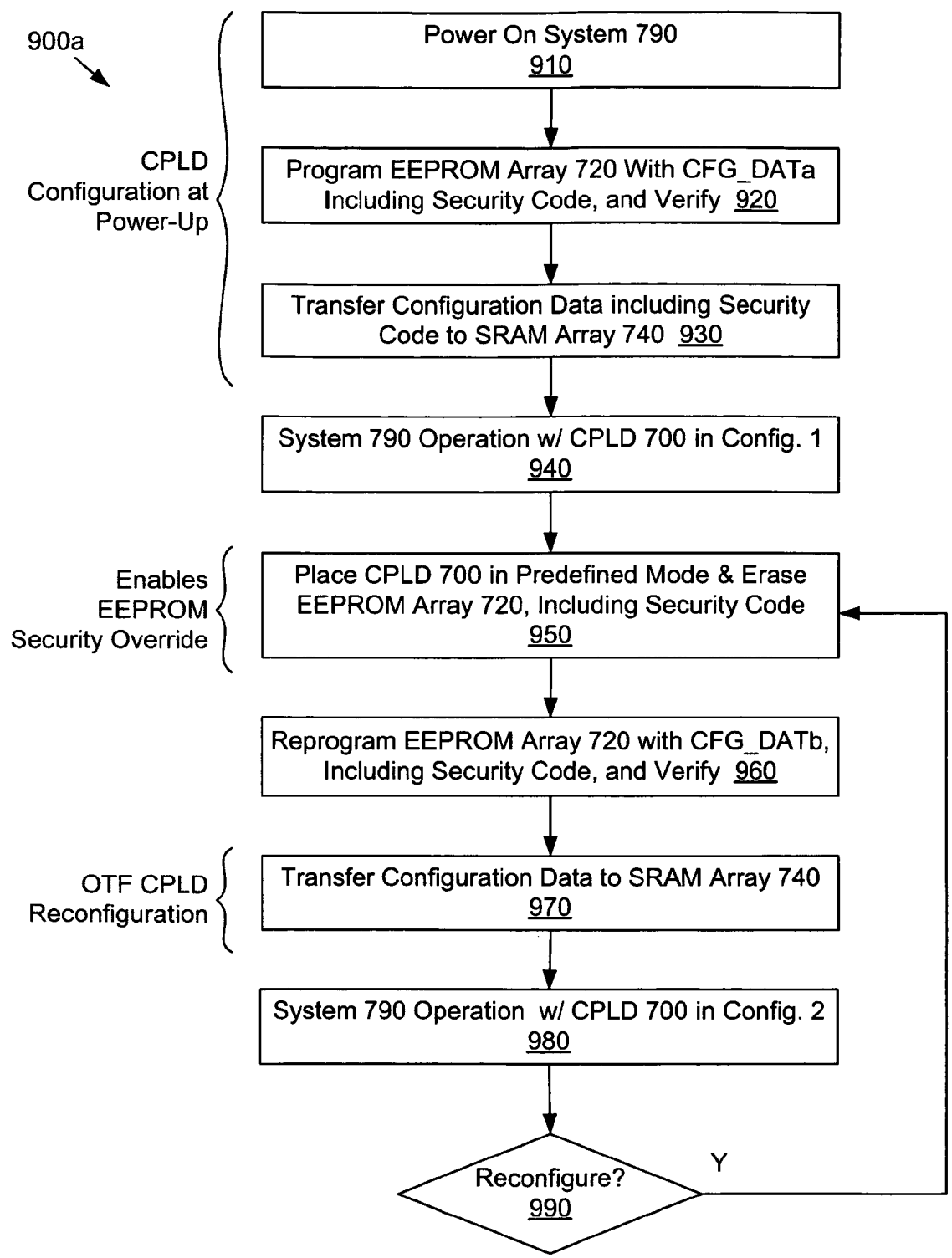
FIG. 9a shows a flow diagram for an OTF CPLD reconfiguration operation, where the CPLD includes a security feature.

FIG. 9a shows a flow diagram 900a that describes the initial configuration and subsequent OTF reconfiguration of CPLD 700. In step 910, power is provided to system 790, and in step 920, a first set of configuration data (configuration data CFG_DATa shown in FIG. 7) is programmed into EEPROM array 720. Configuration data set CFG_DATAa includes a security code, which is stored in location 720a of EEPROM array 720. Once the programmed data has been verified, the configuration data can be transferred to shadow SRAM array 740, as indicated in step 930. The security code is also transferred, to location 740a of SRAM array 740. As previously described, the presence of the correct security code in location 740a of SRAM array 740 prevents the reading of data from EEPROM array 720 and SRAM array 740, and also prevents the writing of new data to EEPROM array 720. System 790 can then begin operating with CPLD 700 in a first configuration (configuration 1), as indicated in step 940.

While system 790 is operating with CPLD 700 in the first configuration, CPLD 700 is placed in a predefined mode and EEPROM array 720 is erased, including the security code present in EEPROM array location 720a, as indicated in step 950. (In some embodiments, it is not necessary to place the CPLD in a predefined mode.) Without the presence of a security override, the security code in location 740a of SRAM array 740 would prevent the writing of new data to EEPROM array 720. However, the erasure of EEPROM 720 with the CPLD in a predefined mode (step 950) enables the EEPROM security override.

While system 790 continues to operate with CPLD 700 in the first configuration, EEPROM array 720 is reprogrammed with a second set of configuration data, as indicated in step 960. Then, to perform an OTF reconfiguration of CPLD 700, this new set of configuration data is transferred from EEPROM 720 to SRAM array 740 in step 970. The timing of this configuration data transfer operation can be specified in various ways, including being defined by instruction C_INST shown in FIG. 7, or being executed in response to a user input. In any case, once the second set of configuration data has been transferred into SRAM array 740, CPLD 700 operates in a new configuration (configuration 2), as indicated in step 980. Thus, the reconfiguration of CPLD 700 takes place without halting system operation.

Subsequent OTF reconfigurations can be performed by reprogramming EEPROM array 720 in the background and transferring that new configuration data to SRAM array 740 at a desired time, as indicated in step 990.

In other embodiments (not shown), SRAM array 740 can be loaded with the new configuration data set by performing a "power-up" reconfiguration, in a manner similar to steps 451–460 of FIG. 4c.

In other embodiments (not shown), the CPLD can include a second EEPROM array, in a manner similar to that shown in FIG. 5. A third configuration data set can be loaded into the second EEPROM array by using the security override previously described, and the SRAM array can be loaded with the third configuration data set from the second EEPROM array.

Figure 9B:
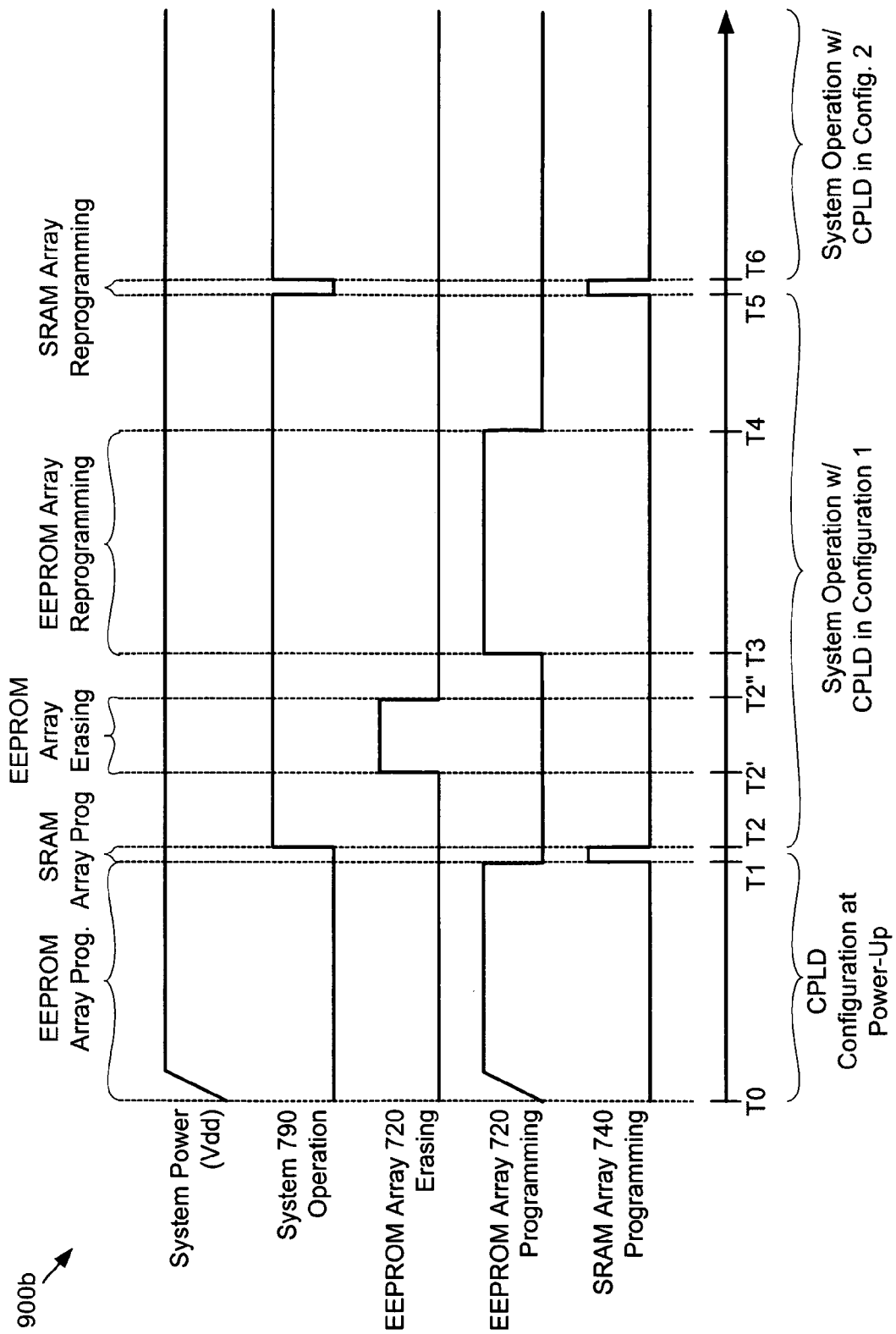
FIG. 9b shows a timing diagram for an OTF CPLD reconfiguration operation, where the CPLD includes a security feature.

FIG. 9b shows a timing diagram 900b for flow diagram 900a shown in FIG. 9a, and shows traces for system power (Vdd), system 790 operation, EEPROM array 720 erasing, EEPROM array 720 programming, and SRAM array 740 programming (note that the pulse widths for the EEPROM array erasing, EEPROM array programming, and SRAM array programming traces are not drawn to scale). As shown in FIG. 9b, when system power is first applied at time T0, programming of EEPROM array 720 with a first set of configuration data commences. Once EEPROM array 720 is fully programmed (at time T1), SRAM array 740 can be programmed with the configuration data stored in EEPROM array 720. Upon completion of this data transfer operation (at time T2), system 790 can begin operating with CPLD 700 in a first configuration (configuration 1). As indicated, the time period between times T0 and T2 corresponds to the "CPLD Configuration at Power-Up" portion of flow diagram 900a (steps 910–930).

Note that the transfer of the correct security code into location 740a of SRAM array 740 enables the security feature of CPLD 700, and at this point new data cannot be read from or loaded into EEPROM array 720, or read from SRAM array 740.

While system 790 is operating with CPLD 700 in configuration 1 (from time T2 to time T5), EEPROM array 720 is erased with the CPLD in a predefined mode, thereby enabling the EEPROM security override. This erasure occurs between times T2' and T2". Note that this background erasure of EEPROM array 720 does not affect the operation of system 790, because the configuration of CPLD 700 is only controlled by SRAM array 740.

While system 790 continues operating with CPLD 700 in configuration 1, EEPROM array 720 is reprogrammed between times T3 and T4. The active EEPROM security override permits the writing of new data to EEPROM array 720. Note that this background reprogramming of EEPROM array 720 does not affect the operation of system 790, because the configuration of CPLD 700 is only controlled by SRAM array 740.

Then, at a desired time T5, the new configuration data set in EEPROM array 720 is loaded into SRAM array 740, so that from time T6 onward, system 790 operates with CPLD 700 in a new configuration (configuration 2). The period of reconfiguration between times T5 and T6 is short enough that the transition from configuration 1 to configuration 2 effectively occurs without interruption to the operation of system 790. In this manner, OTF reconfiguration can be performed on CPLD 700.

Note that if the new configuration data set loaded into SRAM array 740 does not include the correct (e.g., enabling) security code, the step of loading the new configuration data set into SRAM array 740 will disable the security feature of the CPLD.

Although the present invention has been described in connection with several embodiments, it is understood that this invention is not limited to the embodiments disclosed, but is capable of various modifications that would be apparent to one of ordinary skill in the art. Thus, the invention is limited only by the following claims and their equivalents.

What is claimed is:

1. A computer readable storage medium storing an instruction for a complex programmable logic device (CPLD), the CPLD comprising a first electrically-erasable programmable read-only memory (EEPROM) array, a static random access memory (SRAM) array, a control circuit configured to load data from the first EEPROM array into the SRAM array and including a security circuit for protecting the data stored in the EEPROM array and the SRAM array, and a plurality of macrocells connected by a programmable interconnect matrix, the medium comprising:
   code for storing a first set of configuration data in the SRAM array to configure the plurality of macrocells and the programmable interconnect matrix to place the CPLD in a first configuration, the first set of configuration data comprising a security code used by the security circuit to prevent writing to the EEPROM array except under a set of limited circumstances; and
   code for programming the EEPROM array with a second set of configuration data while operating an electronic system with the CPLD in the first configuration.

2. The computer readable storage medium of claim 1, wherein the set of limited circumstances includes the application of an erase pulse to the EEPROM array, the erase pulse being of at least a predetermined duration sufficient to ensure erasure of the first set of configuration data from the EEPROM array.

3. The computer readable storage medium of claim 2, wherein the erase pulse is of a longer duration than is required to ensure erasure of the first set of configuration data from the EEPROM array.

4. The computer readable storage medium of claim 1, wherein the set of limited circumstances includes the placement of the CPLD in a predetermined operational mode.

5. The computer readable storage medium of claim 1, wherein the computer-readable storage medium comprises a floppy disk.

6. The computer readable storage medium of claim 1, wherein the computer-readable storage medium comprises a CDROM.

7. The computer readable storage medium of claim 1, wherein the computer-readable storage medium comprises a hard drive accessible across a network.

8. A computer readable storage medium storing an instruction for a complex programmable logic device (CPLD), the CPLD comprising a first electrically-erasable programmable read-only memory (EEPROM) array, a static random access memory (SRAM) array, a control circuit configured to load data from the first EEPROM array into the SRAM array and including a security circuit for protecting the data stored in the EEPROM array and the SRAM array, and a plurality of macrocells connected by a programmable interconnect matrix, the medium comprising:
   code for programming the EEPROM array with a first set of configuration data;
   code for transferring the first set of configuration data from the EEPROM array to the SRAM array under control of the control circuit, the first set of configuration data comprising a security code used by the security circuit to prevent writing to the EEPROM array except under a set of limited circumstances;

code for operating the CPLD in a first configuration based on the first set of configuration data transferred to the SRAM array;

code for erasing the EEPROM array after transferring the first set of configuration data from the EEPROM array to the SRAM array and while operating the electronic system with the CPLD in the first configuration; and code for reprogramming the EEPROM array with a second set of configuration data while operating an electronic system with the CPLD in the first configuration.

9. The computer readable storage medium of claim 8, wherein the set of limited circumstances includes the application of an erase pulse to the EEPROM array, the erase pulse being of at least a predetermined duration sufficient to ensure erasure of the first set of configuration data from the EEPROM array.

10. The computer readable storage medium of claim 9, wherein the erase pulse is of a longer duration than is required to ensure erasure of the first set of configuration data from the EEPROM array.

11. The computer readable storage medium of claim 8, wherein the set of limited circumstances includes the placement of the CPLD in a predetermined operational mode.

12. The computer readable storage medium of claim 8, further comprising:

code for transferring the second set of configuration data from the EEPROM array to the SRAM array under control of the control circuit; and code for operating the CPLD in a second configuration based on the second set of configuration data transferred to the SRAM array.

13. The computer readable storage medium of claim 12, wherein the code for transferring the second set of configuration data from the EEPROM array to the SRAM array comprises code for transferring the second set of configuration data from the EEPROM array to the SRAM array without terminating normal operation of the electronic system.

14. The computer readable storage medium of claim 8, further comprising:

code for removing power from the CPLD; and code for restoring power to the CPLD, wherein the SRAM array reads the second set of configuration data from the EEPROM array when power is restored to the CPLD.

15. The computer readable storage medium of claim 8, wherein the computer-readable storage medium comprises a floppy disk.

16. The computer readable storage medium of claim 8, wherein the computer-readable storage medium comprises a CDROM.

17. The computer readable storage medium of claim 8, wherein the computer-readable storage medium comprises a hard drive accessible across a network.

* * * * *